US012609606B2

(12) United States Patent
Degrenne et al.

(10) Patent No.: US 12,609,606 B2
(45) Date of Patent: Apr. 21, 2026

(54) POWER SEMICONDUCTOR MODULE WITH ONLINE DEAD-TIME ADJUSTMENT BASED ON A TEMPERATURE SENSITIVE ELECTRICAL PARAMETER

(71) Applicant: Mitsubishi Electric Corporation, Tokyo (JP)

(72) Inventors: Nicolas Degrenne, Rennes Cedex (FR); Julio Brandelero, Rennes Cedex (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 535 days.

(21) Appl. No.: 18/266,498

(22) PCT Filed: Jun. 30, 2021

(86) PCT No.: PCT/JP2021/025536
§ 371 (c)(1),
(2) Date: Jun. 9, 2023

(87) PCT Pub. No.: WO2022/158002
PCT Pub. Date: Jul. 28, 2022

(65) Prior Publication Data
US 2024/0055981 A1    Feb. 15, 2024

(30) Foreign Application Priority Data
Jan. 25, 2021    (EP) .................................... 21305084

(51) Int. Cl.
*H02M 1/38*        (2007.01)
*H02M 1/00*        (2006.01)
(Continued)

(52) U.S. Cl.
CPC ........... *H02M 1/38* (2013.01); *H02M 1/0025* (2021.05); *H02M 1/0058* (2021.05);
(Continued)

(58) Field of Classification Search
CPC ............. H02M 1/0003; H02M 1/0009; H02M 1/0012; H02M 1/0025; H02M 1/0058;
(Continued)

(56) References Cited

U.S. PATENT DOCUMENTS

| | | | |
|---|---|---|---|
| 2005/0184716 A1 | 8/2005 | Brown | |
| 2012/0105034 A1* | 5/2012 | Brown ..................... | H02M 1/38 323/282 |

(Continued)

FOREIGN PATENT DOCUMENTS

| | | | | |
|---|---|---|---|---|
| DE | 102011078579 A1 * | 1/2013 | ........ | H02M 3/33515 |
| WO | WO 2020/151020 A1 | 7/2020 | | |
| WO | WO 2020/193026 A1 | 10/2020 | | |

OTHER PUBLICATIONS

International Search Report and Written Opinion for International Application No. PCT/JP2021/025536, dated Oct. 6, 2021, with English translation.

*Primary Examiner* — Thienvu V Tran
*Assistant Examiner* — Shahzeb K Ahmad
(74) *Attorney, Agent, or Firm* — Birch, Stewart, Kolasch & Birch, LLP

(57) ABSTRACT

Provided is a method to control a power semiconductor module comprising monitoring at least one operating parameter, and only if the operating parameter is kept into a range and the operating parameter's range has an initial status, initiate a calibration stage. The calibration stage is including measuring a first temperature sensitive electrical parameter, decreasing the dead-time, monitoring said operating parameter, measuring a second temperature sensitive electrical parameter, only if the operating parameter has been kept into said range and the value of the second temperature sensitive electrical parameter corresponds to a lower value of the temperature, assigning the value of the dead-time, else only if the operating parameter has been kept into the range and (Continued)

the value of the second temperature sensitive electrical parameter corresponds to a higher value of the temperature, updating the status, storing the dead-time with the operating parameter's range.

15 Claims, 8 Drawing Sheets

(51) Int. Cl.
| | | |
|---|---|---|
| *H02M 3/158* | (2006.01) | |
| *H02M 7/5387* | (2007.01) | |
| *H03K 17/13* | (2006.01) | |
| *H03K 17/14* | (2006.01) | |

(52) U.S. Cl.
    CPC ......... *H02M 3/158* (2013.01); *H02M 7/5387* (2013.01); *H03K 17/133* (2013.01); *H03K 17/145* (2013.01)

(58) Field of Classification Search
    CPC ........ H02M 1/32; H02M 1/325; H02M 1/327; H02M 1/38; H02M 1/385; H02M 3/156; H02M 3/157; H02M 3/158; H02M 3/1588; H02M 7/538; H02M 7/5387; H03K 17/133; H03K 17/145
    See application file for complete search history.

(56) References Cited

U.S. PATENT DOCUMENTS

| | | | |
|---|---|---|---|
| 2016/0380536 A1* | 12/2016 | Rowald ................. | H02M 3/156 323/271 |
| 2018/0141457 A1* | 5/2018 | Lee ................... | H02M 3/33523 |
| 2020/0313570 A1* | 10/2020 | Hall ................... | H02M 1/4233 |

* cited by examiner

POWER SEMICONDUCTOR MODULE WITH ONLINE DEAD-TIME ADJUSTMENT BASED ON A TEMPERATURE SENSITIVE ELECTRICAL PARAMETER

TECHNICAL FIELD

This disclosure pertains to the field of power converters, and especially to the improvement of the converters' efficiency and reliability.

BACKGROUND ART

It is known that tuning parameters of power converters is of foremost importance to improve the converters' efficiency and reliability. In particular, it is known that performances of the converters are directly correlated to the duration of the dead-time, where the dead-time is defined as a time delay during which two power switches of the converter connected in series are controlled in the off state. The control of the power switches is typically performed through a gate signal. For an optimal value of the dead-time, the free-wheeling switch, i.e. the switch conducting during a free-wheeling state of a module of the converter, is switched in a quasi-zero-voltage state resulting in no switching loss. Nevertheless, insufficient dead-time's values result in cross-conduction or in hard turn-on switching of the freewheeling switch. On the other hand, excessive dead-time's values result in conduction losses through the switch's body-diode and/or switching losses due to the diode reverse recovery.

Therefore, a significant parameter to adjust in synchronous rectification circuits is the dead-time of the converter's switches. In the art, dead times are generally fixed to a constant over-estimated value satisfying the worst-case conditions. For example, a typical value of the dead-time is 1 μs. This adjustment is suboptimal because it is not specific to the switches, auxiliary components and operating conditions. Other methods overcome this limitation by dynamically determining the dead-time based on a detection of the body-diode's conduction state or by exploiting computations of the converter's performances; such as the losses or the efficiency.

Still, these methods require efficient and deeply integrated sensors, which need to be fast and/or to be taken in combination with other sensors, and/or may rely on assumptions concerning the operating conditions. Hence; these methods are most of the time not effective and/or costly.

SUMMARY OF INVENTION

This disclosure improves the situation.

It is proposed a method to control a power semiconductor module comprising:

a. monitoring at least one operating parameter of said module, said at least one parameter including load current and/or input current, ambient temperature, input voltage and/or output voltage value, b. only if said at least one operating parameter is kept into a predefined range during a first time, and only if said at least one operating parameter's range of values has an initial non-updated status in a lookup table, initiate at least once a calibration stage, wherein a prevailing dead-time results from a previous calibration stage or is set as an initial over-estimated value if no calibration stage has been previously run, said calibration stage including
  i. measuring a first temperature sensitive electrical parameter;
  ii. decreasing the prevailing dead-time to a provisional dead-time;
  iii. during a second time subsequent to the first time, monitoring said at least one operating parameter;
  iv. after said second predefined time, measuring a second temperature sensitive electrical parameter, said second temperature sensitive electrical parameter being of the same type as the first one;
  v. only if
    said at least one operating parameter has been kept into said predefined range during said second predefined time and
    the value of the second temperature sensitive electrical parameter corresponds to a lower value of the temperature of a module's switch than the temperature value corresponding to the first temperature sensitive electrical parameter, assigning the value of the provisional dead-time to the prevailing dead-time
    else only if
    said at least one operating parameter has been kept into said predefined range during said second predefined time and
    the value of the second temperature sensitive electrical parameter corresponds to a higher value of the temperature of a module's switch than the temperature value corresponding to the first temperature sensitive electrical parameter, updating the status of said at least one operating parameter's range of values in said lookup table,
  vi. storing the prevailing dead-time along with said at least one operating parameter's range of values into said lookup table.

The power semiconductor module includes at least two switches connected in series. In this case, each pair of switches constitutes a commutation cell of the module. A power converter comprises at least one module.

A dead-time providing a minimized value of the temperature of a module's switch for the at least one operating parameter's range of values is obtained. Losses in the are therefore reduced when implementing this value of the dead-time, resulting in an increased efficiency and reliability of the module for the operating parameter's range of values. In particular, with the method of the disclosure, the temperature sensitive electrical parameters do not need to be calibrated in an absolute way. In fact, the values of the temperature sensitive electrical parameters are not considered per se but are compared to evaluate the effect of the dead-time's variation. Hence, the production time of the module is reduced since no absolute calibration of the temperature sensitive electrical parameters is required. In addition, the proposed method has low computational requirements and does not rely on a model, hence the method can be executed in parallel to operating conditions such that the real conditions are considered, resulting in a simple and precise determination of the adjusted dead-time.

In another aspect, it is proposed a computer software comprising instructions to implement at least a part of a method as defined here when the software is executed by a processor. In another aspect, it is proposed a computer-readable non-transient recording medium on which a software is registered to implement the method as defined here when the software is executed by a processor. In another aspect, it is proposed a power semiconductor module designed to implement at least a part of a method as defined here. The power semiconductor module includes at least two switches connected in series.

The following features can be optionally implemented, separately or in combination one with the others.

According to an embodiment, stages a. and b. are iterated until the status of the operating parameter's range of values is updated in the lookup table. As a consequence, the adjusted dead-time corresponds to the lowest value of the temperature of the module's switch(es) obtained with the method of the description. The losses of the module are hence the lowest obtained with the method of the description when implementing this value of the dead-time.

According to an embodiment, the decreasing of the prevailing dead-time is made by a step comprised between 1 and 100 ns. Such a range of values enables to tune the value of the adjusted dead-time depending on the required precision.

According to an embodiment of the description, the calibration stage is performed during an operating stage of the power semiconductor module. Hence, the real conditions are considered, which is not the case when simulations or factory settings are implemented, resulting in an adjusted dead-time responding to the real conditions' constraints, including parameters' drift with aging, and an effective reduction of the losses in real conditions.

According to an embodiment, the temperature sensitive electrical parameters themselves are of a type defined as a difference between values of a temperature sensitive electrical parameter before and after an increase of a switching frequency. Such a differential approach increases the sensitivity of the temperature sensitive electrical parameter to the temperature of the module's switch(es). The higher the switching frequency, the higher the sensitivity of the temperature sensitive electrical parameter to the temperature of the module's switch(es). In addition, the differential approach reduces biases in the measurement and enables to quickly observe the impact of the dead-time on the temperature of the module's switch(es).

In addition, according to an embodiment, the operating parameters include at least a current ($I_{load}$) having a periodic waveform and an increase of the switching frequency is performed for a predefined current range of the current periodic waveform. In addition to the previous embodiment, the sensitivity of the temperature sensitive electrical parameter is increased for a predefined current range of the current periodic waveform. Therefore, the adjusted dead-time is specific to the predefined current range of the current periodic waveform. In addition, it is also possible to perform the method several times (when the value of the current enters the predefined current range of the current periodic waveform) during a modulating period.

Further, according to an embodiment, the calibration stage is performed sequentially for different current ranges of a current periodic waveform. As a consequence, it is possible to adjust different dead-times for different current ranges of the current periodic waveform. Hence, the sensitivity of the different dead-times is increased for the different current ranges respectively.

In addition, according to an embodiment, each increase of the switching frequency is performed on predefined times shorter than and included in said first time and said second time. As a consequence, it is possible to increase the switching frequency for different durations and to evaluate the impact of the dead-time's variation on shorter and longer timescales.

According to an embodiment, at least a part of a method as defined here is applied in parallel to at least two parallel dies of a common power semiconductor module, said module having at least one switch made of at least said two parallel dies with an individual gate access, and the temperature of the module's switch corresponds to the average temperature of the dies, and the calibration stage is applied in parallel to the parallel dies, said calibration stage further including a balancing stage, including:

increasing the dead-time of the die having a measured value of the temperature sensitive electrical parameter corresponding to the highest value of the temperature of the switch's dies, and said balancing stage being applied after the measuring of the first temperature sensitive electrical parameter and/or after the measuring of the second temperature sensitive electrical parameter.

As a consequence, the temperature of the module's switch's dies is globally decreased and more balanced. The dead-times are adjusted to obtain both a lower difference in the temperatures of the dies and a decreased average temperature of the dies forming parts of a switch of the power semiconductor module.

In addition to the previous embodiment, the balancing stage is iteratively applied until all dies have a same value of their temperature sensitive electrical parameters. As a consequence, the adjusted dead-times correspond to the lowest value of the temperature of the module's switch(es) obtained with a method of the description, when all parallel dies have the same value of the temperature sensitive electrical parameter. This increases the reliability and the efficiency of the module.

According to an embodiment, the temperature sensitive electrical parameters are of a type selected among an internal gate resistance of a gate and an on-state voltage at a predefined current value.

According to an embodiment, the temperature sensitive electrical parameters are of a type defined as a voltage measured across a switch of the module in a freewheeling state and during a provoked conduction state of the body-diode. As a consequence, the sensitivity of the temperature sensitive electrical parameter to the temperature is increased, resulting in a finer adjustment of the dead-time and therefore a decrease in the losses of the module.

According to an embodiment, the power semiconductor module comprises:

at least a first sensor for monitoring the at least one operating condition, at least a second sensor for measuring the first and second temperature sensitive electrical parameters, and an integrated circuit on which the method is implemented to control the dead-times.

Other features, details and advantages will be shown in the following detailed description and on the figures.

DESCRIPTION OF EMBODIMENTS

The figures exhibit methods, computer programs and implementation in power semiconductor modules for adjusting dead-times. The methods, computer programs and implementation in power semiconductor modules exploit the variations of temperature sensitive electrical parameters TSEP in response to modifications of the dead-time. This provides a method which has low computational requirements and can be executed in parallel to operating conditions such that the real conditions are considered, which is not the case when simulations or factory settings are implemented.

Figure 1:
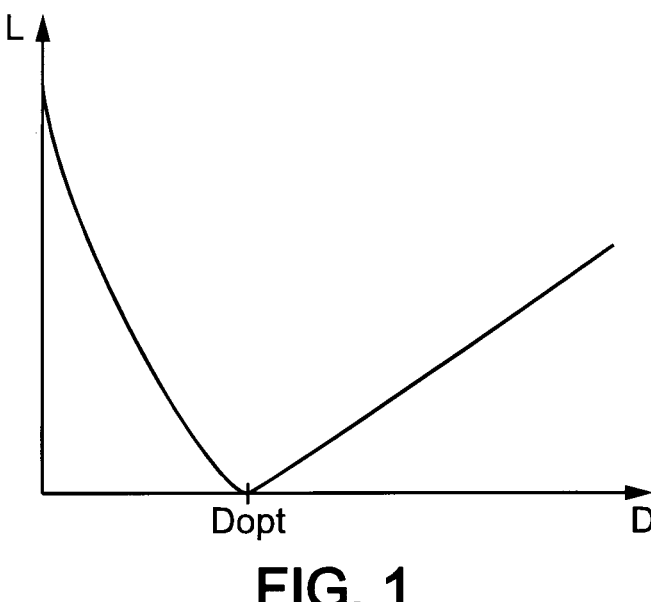
FIG. 1 illustrates the losses L in a power module as a function of the dead time D.

It is now referred to FIG. 1. FIG. 1 schematically illustrates the losses L in a power module as a function of the dead time D. For an optimal value of the dead-time D$_{opt}$, the free-wheeling switch is switched on in a quasi-zero-voltage state resulting in no switching loss. Nevertheless, insufficient dead-time's values (D<D$_{opt}$) result in cross-conduction or in hard turn-on switching of the freewheeling switch. On the other hand, excessive dead-time's values (D>D$_{opt}$) result in conduction losses through the body-diode of the free-wheeling switch and/or of the active switch and/or switching losses due to the diode reverse recovery.

FIGS. 2A to 2D illustrate example values variations which may be obtained when adjusting the dead-time of a power semiconductor module using a method according to the disclosure. The diagrams of these four figures are acquired simultaneously and have a common timeline (abscissa).

Figure 2A:
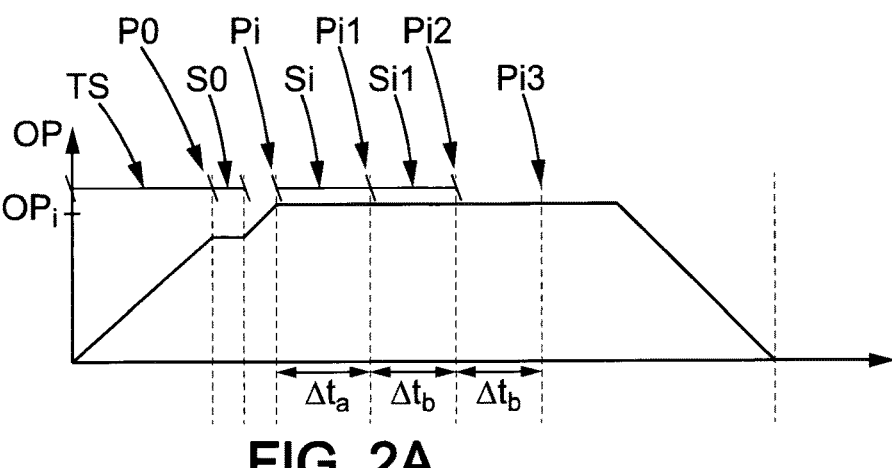
FIG. 2A represents the evolutions of an operating parameter OP.

FIG. 2A is a diagram representing the evolution of an operating parameter OP of the module. For example, the operating parameter OP may be, for example, one of the load current, input current, the ambient temperature, the input voltage and the output voltage value, taken separately or in combination. For a sinusoidal load current, the amplitude of the sinusoidal waveform is for example chosen as the value of the operating parameter OP.

The operating parameters OP can for example be measured by sensors such as a load current's sensor, an input current's sensor, an ambient temperature's sensor, an input voltage's sensor or an output voltage's sensor. Such sensors can be used for other power electronics applications. Dedicated sensors can also be added to the module.

In some alternative embodiments, the operating parameter OP, for instance the load current and/or the input voltage and/or the output voltage, is a controlled variable. In such embodiments, the reference value issued from the controller can be used as the operating parameter OP.

In the following embodiments, the variations of the operating parameter OP are continuously monitored throughout the whole method.

Figure 2B:
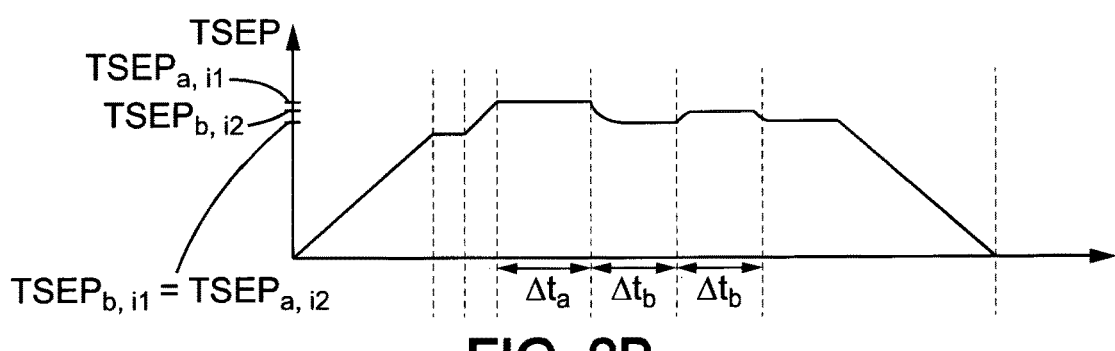
FIG. 2B illustrates the variations of a temperature sensitive electrical parameter TSEP.

FIG. 2B is a diagram representing the variations of a temperature sensitive electrical parameter (abbreviated "TSEP" in the following). A TSEP is a physical property or a combination of physical properties whose value varies with the temperature of the module and more specifically with the temperature of an element of the module such as a switch or a die forming parts of a switch. In the technical field, a TSEP is used to monitor indirectly the temperature of the die when it is impossible to directly measure said temperature, for example due to lack of space or complexity to dispose a sensor in the immediate vicinity of the die. It enables to follow the variations of the temperature when knowing the variations is as informative as the absolute value or the exact value of the temperature. For example, the TSEP may be an internal gate resistance of a die or an on-stage voltage at a predefined current value. In such examples, the TSEP has a positive temperature coefficient: when the temperature increases, the TSEP increases and vice versa. But the method would still be valid for TSEP with negative temperature coefficient, for example a threshold voltage. For TSEP with a positive temperature coefficient, the value of the TSEP and the temperature of the die are positively correlated: when the temperature increases, the TSEP increases and vice versa. For negative temperature coefficients, these values are negatively correlated: when the temperature increases, the TSEP decreases and vice versa. It must be noted that the executed method does not require a continuous acquisition of the TSEP. Punctual measures at some precise events and/or periodic measures may be enough.

Figure 2C:
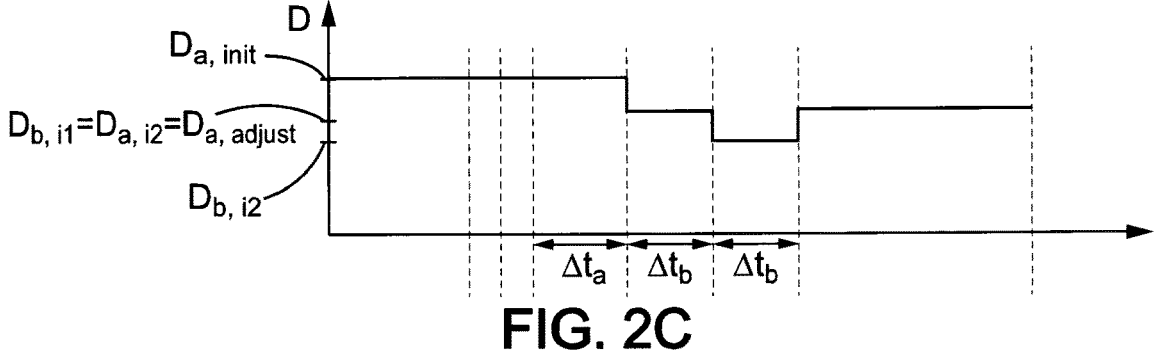
FIG. 2C shows the evolution of a dead-time D.

FIG. 2C is a diagram representing the evolution of the dead-time D. This evolution depends on the evolutions of the operating parameter OP and the TSEP.

For a power semiconductor module, several dead times can be adjusted. For instance, a dead time can be adjusted for an active state of the module and another dead time can be adjusted for a free-wheeling state of the module. Said active state of the module is defined as the state in which the load current goes from a drain to a source of a switch of said module. Said free-wheeling state of the module is defined as the state in which the load current goes from a source to a drain of a switch of said module.

To adjust the dead time corresponding to the active state of the module, the TSEP is, for example, measured during an active state of the module or during a free-wheeling state of the module.

To adjust the dead time corresponding to the free-wheeling state of the module, the TSEP is, for example, measured during a free-wheeling state of the module. When adjusting the dead times corresponding to the free-wheeling state of the module and when the operating conditions OP are the load current and the output voltage, it is, for example, possible to adjust one first dead time corresponding to a first pair of operating conditions OP using the method 100 and to then fill all the values of the dead times corresponding to other pairs of operating conditions OP without using the method 100. This is achieved, for example, by exploiting physical equations of an electrical model which are known by themselves. For example, such a model can be written as:

$$Di(Ii, Vi) = (D1 * I1/V1) * Vi/Ii$$

where D1 is the adjusted first dead time corresponding to the first pair of operating conditions l1 and V1 where l1 is the first load current and V1 is the first output voltage, Di is a dead time to adjust corresponding to a second pair of operating conditions li and Vi where li is the second load current and Vi is the second output voltage.

In some examples, the switch of the module is controlled by a pulse-width modulation signal (or "PWM signal"). In this case, the PWM signal is, for example, modified as a function of the load voltage and current sign. The dead-times typically contribute mostly to the state relative to the free-wheeling conduction state. The PWM must thus compensate for this dead-time depending on the current sign.

Figure 2D:
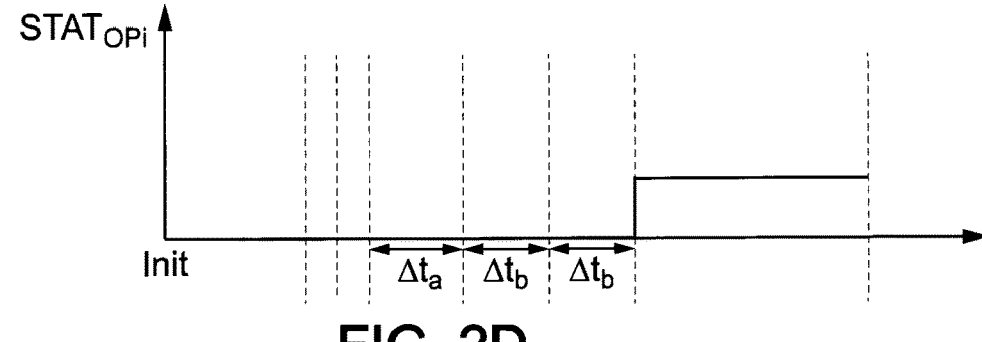
FIG. 2D sketches the evolution of a status $STAT_{OP_i}$ of a particular range of values $OP_i$ of an operating parameter OP.

FIG. 2D is a diagram representing the evolution of the status $\text{STAT}_{OPi}$ of a particular range of values $OP_i$ of the operating parameter OP. The status $\text{STAT}_{OPi}$ is stored and updated in a lookup table. Said lookup table comprises, for example, for a particular range of values of the operating parameter $OP_i$, a value of the TSEP, a dead-time D and a status $\text{STAT}_{OPi}$. In some examples, the lookup table comprises, in addition, for each said status $\text{STAT}_{OPi}$, some substatuses corresponding, for example, to predefined current ranges of the current periodic waveform. Said lookup table is initialized with an over-estimated value for the dead-times. The initial over-estimated value of the dead-time $D_a$ is for example $D_{a,init}$=1000 ns. All statuses and substatuses are initialized to an initial non-updated value.

The four diagrams are analyzed simultaneously below.

Figure 3A:
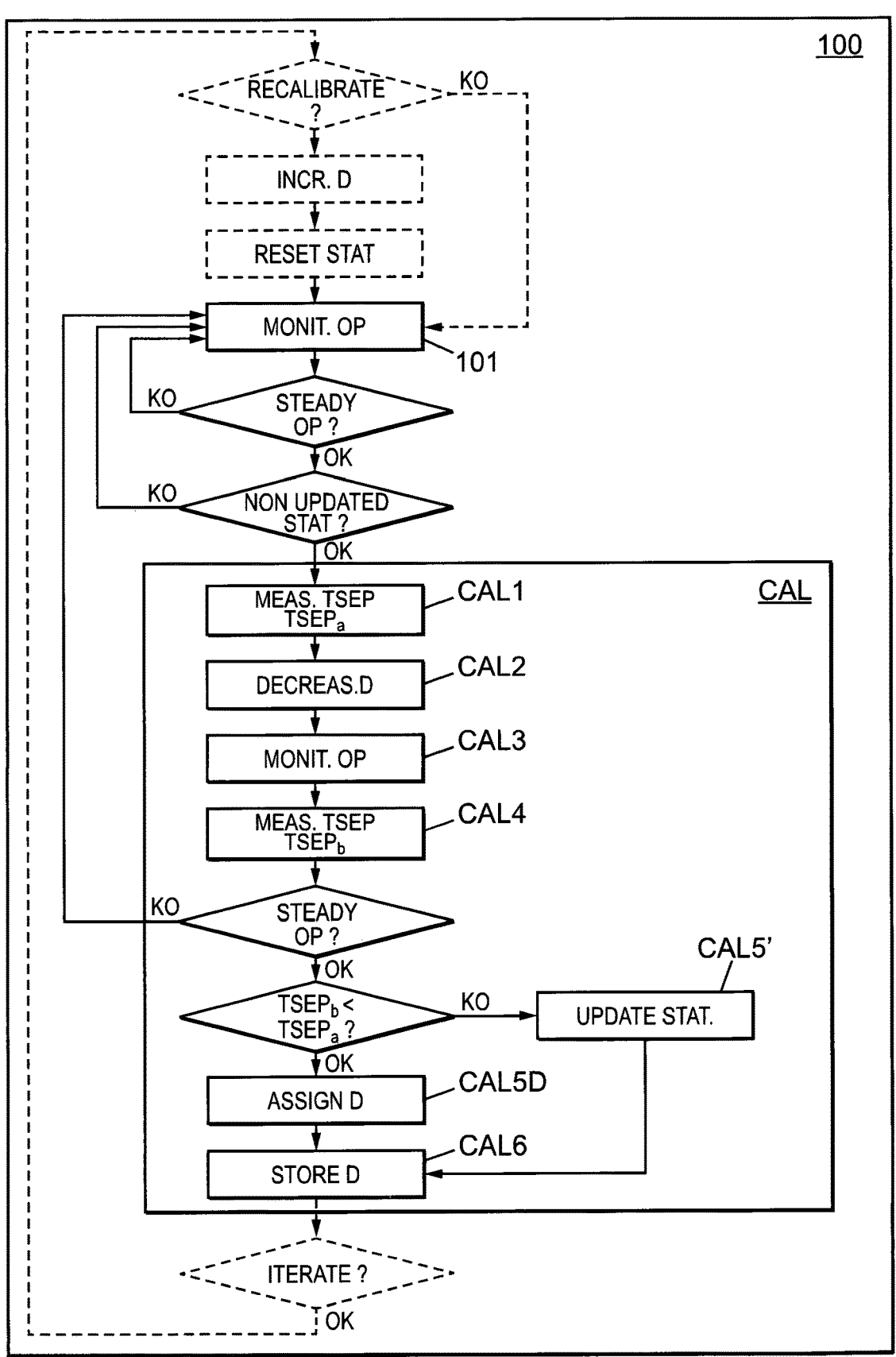
FIG. 3A is a flowchart representing possible stages of a method 100 for adjusting a dead time according to the disclosure.

It is proposed, as shown on FIG. 3A, in a method 100 to control a power semiconductor module. In a first stage 101 of said method 100, at least one operating parameter OP of said module is monitored. A calibration stage CAL is initiated at least once only if said at least one operating parameter OP is kept into a predefined range during a first predefined time $\Delta t_a$, and only if said at least one operating parameter's range of values has an initial non-updated status in a lookup table. In other words, the calibration stage CAL is initiated only if the two following starting conditions are simultaneously met:

1. a steady-state stage has been reached for said operating parameter OP, which is controlled by the values of the operating parameter OP being kept in a predefined range during a first predefined time $\Delta t_a$;
2. said operating parameter's range of values has not already been calibrated, which is controlled by the operating parameter's range of values having an initial non-updated status in a lookup table.

The calibration stage CAL consists in adjusting a prevailing dead-time D based on the variations of a TSEP. The prevailing dead-time $D_a$ either results from a previous calibration stage CAL or is set as an initial over-estimated value if no calibration stage has been previously run.

For the sake of simplicity, it is considered in the example of FIGS. 2A to 2D that all the operating parameter's ranges of values have an initial non-updated status and that no calibration stage has been previously run for any of the operating parameter's ranges of values. In other words, in this example, the condition to initiate the calibration stage depends only on the steadiness of the operating parameter OP. Plus, the values of the initial dead-times are all equal to an initial value $D_{a,init}$, selected by default independently of the operating parameter's range of values.

During the first transient stage TS of this example, the operating parameter OP is continuously monitored as shown on FIG. 2A. Since the value of the operating parameter OP is not stabilized, the dead-time D is kept to its prevailing value $D_{a,init}$. In other words, no action is made to artificially increase or decrease the current dead-time D. A first steady state stage S0 is detected at a first corner point P0. The detection of the first steady state S0 at the first corner point P0 launches a timer to compare the duration of the steady state to a first predefined time $\Delta t_a$. The duration of the steady state S0 is shorter than the first predefined time $\Delta t_a$. Hence, the following of the calibration stage is put on hold and the monitoring of the operating condition 101 is being continued.

A second steady state stage Si is detected at a second corner point Pi. The detection of the second steady state Si at the second corner point Pi launches the timer to compare the duration of said second steady state Si to the first predefined time $\Delta t_a$. Since the duration of this second steady state Si is longer than the first predefined time $\Delta t_a$, the calibration stage is initiated after this first predefined time $\Delta t_a$ at the starting point Pi1.

In a first stage CAL1 of the calibration stage CAL, a first value of the TSEP is measured. In this example, at the starting point Pit, a first value of a TSEP is measured $\text{TSEP}_{a,i1}$ as shown on FIG. 2B. In the example, the TSEP value is continuously monitored even before any steady state. In various embodiments, the TSEP can be monitored only when a steady state is detected.

During a second stage CAL2 of the calibration stage, the value of the prevailing dead-time $D_a$ is decreased to a provisional dead-time $D_b$. For example, the value of the prevailing dead-time $D_a$ is decreased by a step comprised between one and a hundred of nanoseconds.

In this example, the value of the prevailing dead-time $D_{a,init}$ is decreased to a provisional dead-time $D_{b,j1}$ as shown on FIG. 2C.

During a third stage CAL3 of the calibration stage CAL, the operating parameter OP is monitored during a second predefined time $\Delta t_b$. This second predefined time $\Delta t_b$ follows the first predefined time $\Delta t_a$ and is defined as starting from the decrease of the dead-time D. At the end of said second predefined time $\Delta t_b$, a second value of the TSEP is measured during a fourth stage CAL4. There are multiple possibilities for the evolution of the dead-time's value D depending on the previous stages CAL1 to CAL4.

If the operating parameter OP has not been kept into said predefined range during said second predefined time $\Delta t_b$, the calibration stage CAL is terminated. Optionally, the provisional dead-time $D_b$ is cancelled (the prevailing dead-time $D_a$ is restored). In other words, when the operating condition OP has not been steady during the first $\Delta t_a$ and second $\Delta t_b$ predefined times, the method goes back to the monitoring stage 101 and the possible initiation of the calibration stage CAL. It is considered that the operational status of the module is not in a state sufficiently steady to be calibrated in real-time: the calibration stage is at least temporarily aborted.

If the operating parameter OP has been kept into said predefined range during said second predefined time $\Delta t_b$, there are two possibilities CAL5 and CAL5' depending on the value of the measured second temperature sensitive electrical parameter $\text{TSEP}_b$:

if said value of the second TSEP $\text{TSEP}_b$ corresponds to a lower value of the temperature of the module's switch(es) than the temperature value corresponding to the first TSEP $\text{TSEP}_a$, the value of the provisional dead-time $D_b$ is assigned in a stage CAL5D to the prevailing dead-time $D_a$. In other words, if decreasing the dead-time from the prevailing value $D_a$ to the provisional value $D_b$ leads to a decrease in the temperature of the module's switch(es), it is considered that the provisional value $D_b$ is more suitable (better) than the prevailing value $D_a$ at least in the prevailing operational conditions. Hence, the provisional value $D_b$ becomes the new prevailing value $D_a$: the provisional value $D_b$ which was a "temporary test" is confirmed and becomes the operational value.

if said value of the second TSEP $TSEP_b$ corresponds to a higher value of the temperature of the module's switch(es) than the temperature value corresponding to the first TSEP $TSEP_a$, the status of said at least one operating parameter's range of values in said lookup table is updated in a stage CAL5'. Optionally, the provisional dead-time $D_b$ is cancelled (the prevailing dead-time $D_a$ is restored).

In other words, if decreasing the dead-time from the prevailing value $D_a$ to the hypothetical (provisional) value $D_b$ leads to an increase in the temperature of the module's switch(es), then the provisional value $D_b$ is considered less suitable than the prevailing value $D_a$. Hence, the prevailing value $D_a$ is considered as the smallest value leading to a decrease in the temperature of the module's switch(es) and is chosen as the calibrated dead-time value for the module operating under said operating parameter's range of values OP. As a result, the status of said at least one operating parameter's range of values in said lookup table is updated to report that the calibration has been performed and to avoid (at least temporarily) a future calibration stage for the same operational conditions.

In all cases, the value of the prevailing dead-time $D_a$, updated or not, is stored in the lookup table with said at least one operating parameter's range of values in order to keep the most efficient value for said at least one operating parameter's range of values that has already been tested.

Consequently, in this example, a timer is launched at the starting point Pi1 to compare the duration of the steady-state Si 1 starting at the starting point Pi1 to a second predefined time $\Delta t_b$. During this second predefined time interval $\Delta t_b$, the operating parameter OP is continuously monitored. At the end of this second predefined time interval $\Delta t_b$, a second value of the TSEP is measured $TSEP_{b,i1}$ at the intermediate point Pi2. Since the operating parameter OP has been kept into the same predefined range OPi during the first $\Delta t_a$ and during the second $\Delta t_b$ predefined time intervals and the value of the second TSEP $TSEP_{b,i1}$ corresponds to a lower value of the temperature of the module's switch(es) than the temperature value corresponding to the first TSEP $TSEP_{a,i1}$, the prevailing dead-time $D_{a,i2}$ takes the value of the provisional dead-time $D_{b,i1}$. Plus, the value of the status $STAT_{OPi}$ corresponding to the particular range of values OPi is kept to its initial non-updated value in order to authorize a future iteration of the calibration stage to enhance, again, the dead-time value. The prevailing dead-time $D_{a,i2}$ is stored in the lookup table along with said at least one operating parameter's range of values OPi during a stage CAL6.

Typically, the first predefined time $\Delta t_a$ has a value comprised between tens of milliseconds and tens of seconds. For example, said first predefined time $\Delta t_a$ can correspond to the thermal transient of the die. To obtain a constant value of the die's temperature, all components of the module may have reached a thermal steady-state. A longer predefined time $\Delta t_a$ is therefore needed when looking for a constant value of the die's temperature in comparison to embodiments where differences between values of the die's temperature are considered.

The value of said first predefined time $\Delta t_a$ can be dynamically determined. In other words, "predefined" does not necessarily means "fixed". On the contrary, it can be defined in advance but in function of the module behavior. For instance, the first predefined time $\Delta t_a$ is chosen as the duration of the TSEP's transient. This is, for example, achieved by detecting when the TSEP has reached a steady state. In some implementation, said detection of the steady state comprises successively comparing two values of the TSEP measured in successive samples. As long as the values of the TSEP measured in successive samples are different, the steady state has not been reached. Once the values of the TSEP measured in successive samples are equal, the steady state has been reached and the first predefined time $\Delta t_a$ is over.

The second predefined time $\Delta t_b$ can be chosen as equal to the first predefined time $\Delta t_a$ or as a fraction of the first predefined time $\Delta t_a$. For example, the fraction can be comprised between one per thousand and a hundred per thousand.

In some embodiments, the output current signal of the module is sinusoidal. This sometimes results in some oscillations at a modulating period of the output current in the temperature of the die. In such cases, the second predefined time $\Delta t_b$ is, for example, chosen as an integer factor of said modulating period of the output current.

In some embodiments, the monitoring stage 101 and the calibration stage CAL can be iterated until the status of the operating parameter's range of values is updated in the lookup table. This is symbolized on FIG. 3A by a dashed line.

In addition, in some embodiments, when the monitoring stage 101 and the calibration stage CAL are iterated, the value of the prevailing dead-time $D_a$ can be decreased to the provisional dead-time $D_b$ by an adaptive step. In other words, the value of the decrement is initialized with a value comprised between one and a hundred of nanoseconds. During the iterations of the monitoring stage 101 and the calibration stage CAL, if decreasing the dead-time from the prevailing value $D_a$ to the hypothetical (provisional) value $D_b$ leads to a smaller decrease in the temperature of the module's switch(es), then the value of the decrement is decreased. For instance, a gradient descent can be implemented.

For example, on FIG. 2D, since the value of the status $STAT_{OPi}$ keeps its initial non-updated value at point Pi2, another iteration of the calibration stage can be initiated at the intermediate point Pi2. At the starting point Pi2, a first value of a TSEP is measured $TSEP_{a,i2}$ and the value of the prevailing dead-time $D_{a,i2}$ is retrieved from the lookup table and is decreased (again) to a provisional dead-time $D_{b,i2}$. A timer is launched at the first starting point Pi2 to compare the duration to the second predefined time $\Delta t_b$. During this second predefined time interval $\Delta t_b$ the operating parameter OP is continuously monitored. At the end of this second predefined time interval $\Delta t_b$, a second value of the TSEP is measured $TSEP_{b,i2}$ at a second intermediate point Pi3. Since the operating parameter OP has been kept into the same predefined range $OP_i$ during the second $\Delta t_b$ predefined time interval starting from the first intermediate point Pi2 but the value of the second TSEP $TSEP_{b,i2}$ corresponds to a higher value of the temperature of the module's switch(es) than the temperature value corresponding to the first temperature sensitive electrical parameter $TSEP_{a,i2}$, the value of the status $STAT_{OPi}$ corresponding to the particular range of values $OP_i$ is updated and the calibration stage is over. The prevailing dead-time $D_{a,i2}$ does not take the value of the provisional dead-time $D_{b,i2}$. Optionally, the provisional dead-time $D_{b,i2}$ is cancelled (the prevailing dead-time $D_{a,i2}$ is restored). Finally, the adjusted dead-time $D_{a,adjust}$ corresponding to this particular range of values $OP_i$ is the prevailing dead-time $D_{a,i2}$.

In an embodiment, the method 100 is performed during an operating stage of the power semiconductor module. In other words, the monitoring stage 101 is constantly running in the background and the calibration stage CAL is launched as soon as its two starting conditions are simultaneously met. The method 100 can also be performed under imposed fixed operating conditions OP. For example, such conditions can be imposed at the end of the production line of the power semiconductor module or in a final system comprising the power semiconductor module. The method 100 can either be performed once in the lifetime of the power semiconductor module or regularly.

In the above embodiments, the calibration method is performed once and for all (for each operational condition). In various embodiments, especially to consider the inevitable natural drift of the components during the real life of the components, it could be better to readjust the module's dead-times several times, for example periodically, during the operational use of the components. For a recurrent readjustment of the module's dead-times, the calibration stage CAL can comprise the following additional stages, sketched in dashed lines on FIG. 3A:

the updating during the CAL5' of the status of said at least one operating parameter's range of values in said lookup table launches a timer, the timer being compared to a calibration predefined time $\Delta t_{CAL}$.

The value of the calibration predefined time $\Delta t_{CAL}$ can be comprised between one day and twelve months, depending on the robustness to drift of the components and the required precision. The most robust components require the less recalibrations during their lifetime. The components needing the most precision in the adjustment of the dead-time require the most recalibrations during their lifetime.

When the timer exceeds the calibration predefined time $\Delta t_{CAL}$, the value of the prevailing dead-time $D_a$ is, for example, stored in a stack of the lookup table along with said at least one operating parameter's range of values. The value of the prevailing dead-time $D_a$ is artificially modified. For example, the prevailing dead-time $D_a$ is artificially increased, for example by a value comprised between ten nanoseconds and a hundred of nanoseconds. The value of the prevailing dead-time $D_a$ can also be computed based on the values stored in the stack of the lookup table corresponding to said at least one operating parameter's range of values. For example, the prevailing dead-time $D_a$ is computed as a mean or a median or a weighted mean or a weighted median of the values stored in said stack. In some embodiments, the weights are proportional to the order in the stack: the last values added in the stack have a higher weight than the first ones. After having artificially modified the value of the prevailing dead-time $D_a$, the status of said at least one operating parameter's range of values in said lookup table is reinitialized to the non-updated status.

Hence, the calibration stage CAL is launched as soon as its two starting conditions are simultaneously met.

Alternately, in some examples, in addition to measuring the TSEP in stages CAL1 and CAL4 and performing the dead-time decrease iteratively, the optimal dead-time can be guessed more directly. The losses (P1 and P2) can be expressed in this way:

P1=TSEP1/Rth, P2=TSEP2/Rth, Rth being a scaled thermal resistance relative to the power module The losses are also expressed in this way:

P1=A+Tcond1*Pcond, P2=A+Tcond2*Pcond, A being a constant including other losses in the die, such as losses during the normal conduction (i.e. not related to the dead-times), Pcond being the conduction losses in the body-diode, typically Vbd*I.

Finally, the conduction times of the body diode can be assumed to be related to the dead-time with this example formulae:

$$D1=B+Tcond1, D2=B+Tcond2, B \text{ being a constant}$$

Re-arranging the above equations:

$$B=(TSEP2-TSEP1)/(Rth*Pcond)+D2$$

Thus, by defining D=B, the conduction time of the body-diode is theoretically zero.

In some embodiments, the TSEP themselves are defined as a difference between values of a TSEP before and after an increase of a switching frequency.

In other words, in these examples, during the first measurement stage CAL1 of the calibration stage CAL, a first TSEP $TSEP_{a,1}$ is measured. After having measured the first TSEP $TSEP_{a,1}$, the switching frequency is increased for at least one predefined time $\Delta t_{sw}$. The switching frequency, for example, is increased by a factor comprised between ten and a hundred. At the end of the at least one predefined time $\Delta t_{sw}$, another TSEP $TSEP_{a,2}$ is measured. Then, the first TSEP $TSEP_a$ in the first measurement stage CALL is defined as:

$$TSEP_a=TSEP_{a,2}-TSEP_{a,1}$$

The same method is applied during the second measurement stage CAL2 and the second TSEP $TSEP_b$ is defined as:

$$TSEP_b=TSEP_{b,2}-TSEP_{b,1}$$

Figure 3B:
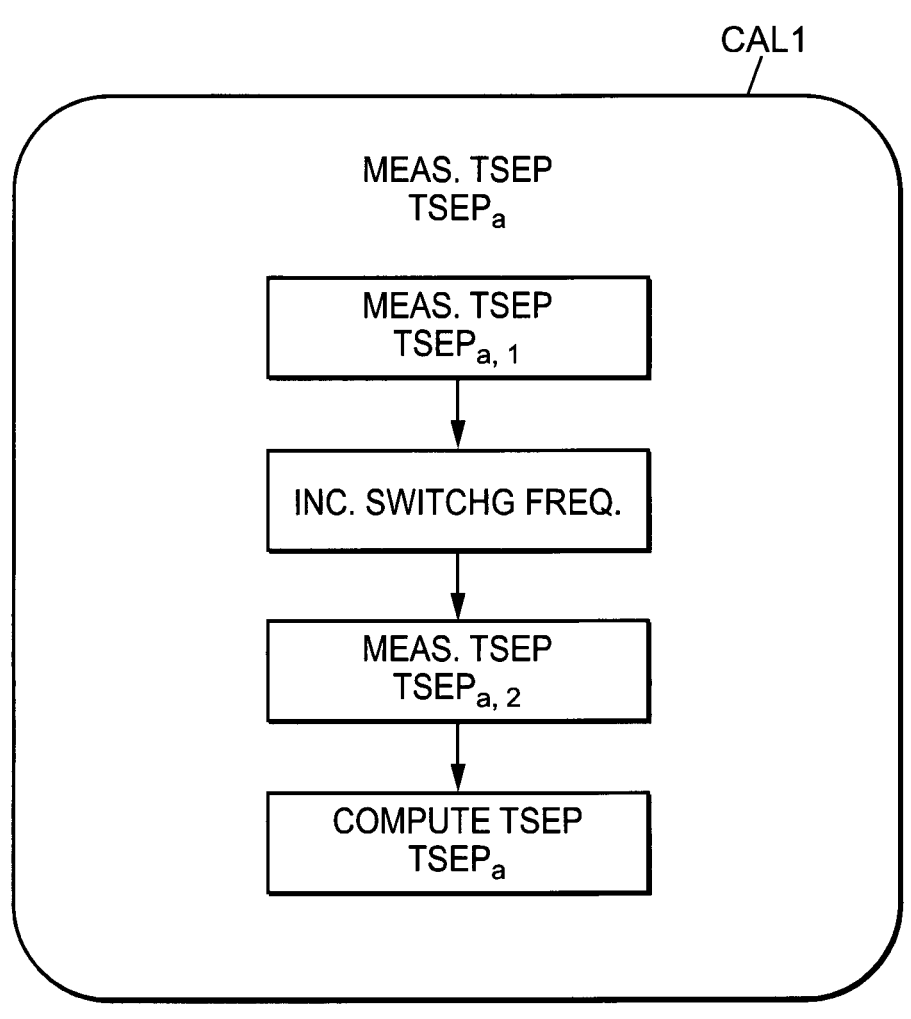
FIG. 3B provides details on a stage CAL1 of the method 100 in an embodiment of the method.

These additional stages of the first measurement stage CAL1 are sketched on FIG. 3B, and would be easily transposed to the second measurement stage CAL2.

Additionally, in some examples, the switching frequency is increased for a predefined current range of a current periodic waveform. In these examples, the operating parameters comprise at least the current, said current having a periodic waveform. In other words, one can adjust for a same range of values of the amplitude of the current periodic waveform different dead-times. These different dead-times correspond to different current ranges of said periodic waveform and are stored, during the storing stage CRL6, in the lookup table along with the operating parameter's range of value and the predefined current range of the current periodic waveform. Therefore, the calibration stage CAL is initiated only if, in addition to the steadiness condition, the status corresponding to the amplitude of the current periodic waveform and the predefined current range for which switching frequency is increased has an initial non-updated value.

In an embodiment, the calibration stage is performed sequentially for different current ranges of a current periodic waveform.

Figure 4A:
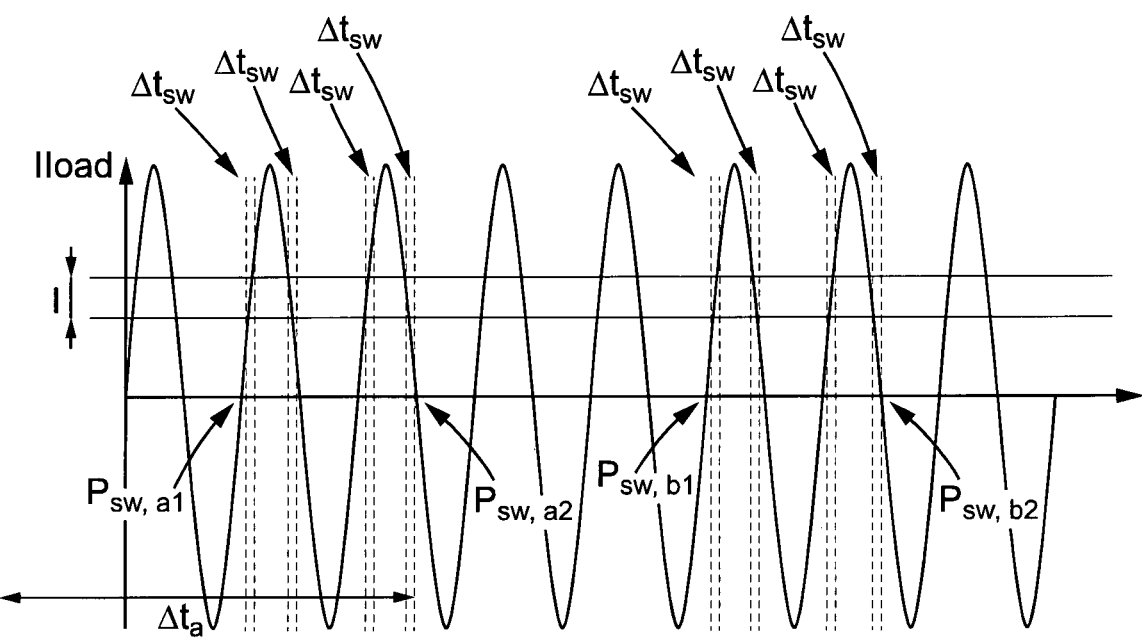
FIG. 4A represents the evolutions of an operating parameter OP.
Figure 4B:
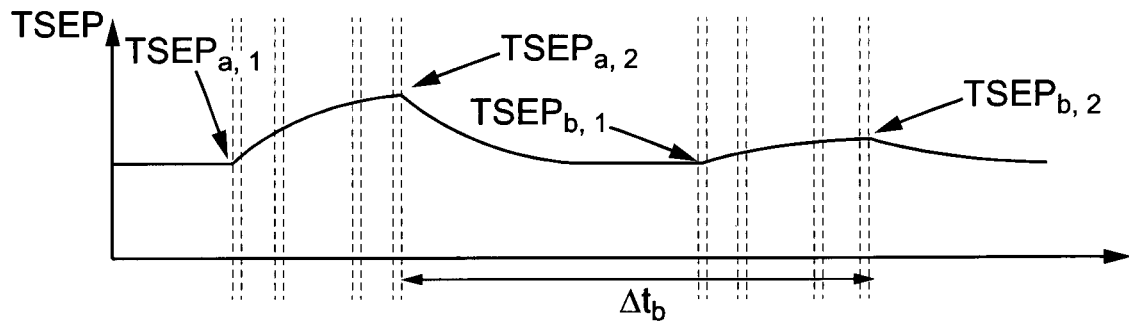
FIG. 4B illustrates the variations of a temperature sensitive electrical parameter TSEP.
Figure 4C:
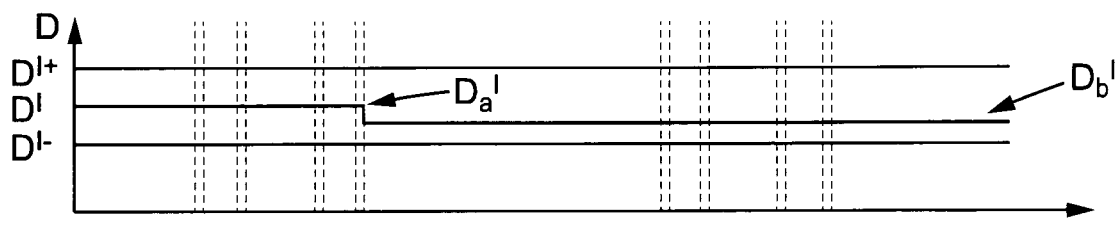
FIG. 4C shows the evolution of different dead-times corresponding different current ranges of the current periodic waveform.

FIGS. 4A to 4C illustrate example values variations which may be obtained when adjusting the dead-time of a power semiconductor module using a method according to the disclosure and a TSEP defined as a difference between values of a TSEP before and after an increase of a switching frequency for a predefined current range of the current periodic waveform. The three figures are acquired simultaneously and have a common timeline (abscissa).

FIG. 4A represents an example of an operating parameter $I_{load}$. In this example, the operating parameter $I_{load}$ is a load current having a sinusoidal waveform. This operating parameter $I_{load}$ is kept into the same predefined range during the whole duration of the example since the maximum amplitude is the same throughout the time.

FIG. 4B is a diagram representing the variations of a TSEP response to a switching frequency increase and a variation of the dead-time.

FIG. 4C is a diagram representing the evolution of three dead-times $D^{I+}$, $D_I$ and $D^{I-}$. These three deadtimes correspond to different current ranges of the current periodic waveform. $D^{I+}$, $D^I$ and $D^{I-}$ correspond to dead times for a high, a medium and a low current range respectively.

In the example of FIGS. 4A to 4C, the switching frequency is increased for a medium current range. For instance, the switching frequency is increased when the load current has a value comprised between forty percent and sixty percent of the load current's maximum amplitude, said maximum amplitude being also known as the nominal current. This means that, in the example of FIGS. 4A to 4C, the dead times for a high $D^{I+}$ and a low $D^{I-}$ current ranges are not presently being adjusted but the method could also be applied for these current ranges in various embodiments.

The three figures are analyzed simultaneously below.

In the beginning of the example, the dead time has a prevailing value $D_a^I$ as shown on FIG. 4C. On FIG. 4A, at the first entering abscissa $P_{sw,a1}$, the value of the load current $I_{load}$ enters a medium range of values I. In parallel, as shown on FIG. 4B, the value of the TSEP $TSEP_{a,1}$ is measured at said first entering abscissa $P_{sw,a1}$. The switching frequency is then increased for a predefined time $\Delta t_{sw}$ during which the value of the load current $I_{load}$ remains in the medium range of values I. Said increase of the switching frequency is performed when the value of the load current $I_{load}$ enters the medium range of values I for a certain number of iterations (periods of the sinusoidal signal).

In the example of FIG. 4A to 4C, the switching frequency is increased four times for the predefined time $\Delta t_{sw}$ when the value of the load current $I_{load}$ enters the medium range of values I. At the end of these four iterations, at a first ending abscissa $P_{sw,a2}$, a second value of the TSEP $TSEP_{a,2}$ is measured. As a consequence, the first value of the TSEP $TSEP_a$ corresponding to the prevailing value $D_a^I$ is computed as:

$$TSEP_a = TSEP_{a,2} - TSEP_{a,1}.$$

In this specific embodiment, the frequency is increased only temporarily during the predefined times $\Delta t_{sw}$. This enables to quickly obtain a difference between the two TSEPs ($TSEP_a$ and $TSEP_b$). It corresponds to a differential approach of the dead-time effect evaluation. In various embodiments, the frequency can be increased continuously during each entire predefined times $\Delta t_a$ and $\Delta t_b$.

In parallel, at the first ending abscissa $P_{sw,a2}$, the prevailing dead time $D_a^1$ is decreased to a provisional dead time $D_b^I$. After the second predefined time $\Delta t_b$, at the second entering abscissa $P_{sw,b1}$, the value of the TSEP $TSEP_{b,1}$ is measured. In this example, the second predefined time $\Delta t_b$ is dynamically determined to be equal to the thermal transient of the die in response to the change of dead time.

Then, the switching frequency is increased for the same predefined time $\Delta t_{sw}$ when the value of the load current $I_{load}$ enters the medium range of values I for the same number of iterations. At the end of the four iterations, at a second ending abscissa $P_{sw,b2}$, a second value of the TSEP $TSEP_{b,2}$ is measured. As a consequence, the second value of the TSEP $TSEP_b$ corresponding to the provisional value $D_b^I$ is computed as:

$$TSEP_b = TSEP_{b,2} - TSEP_{b,1}.$$

The value of the operating parameter $I_{load}$ has been kept within the predefined range during the second predefined time $\Delta t_b$. The value of the second TSEP $TSEP_b$ corresponds to a lower value of the temperature of the module's switch(es) than the temperature value corresponding to the first TSEP $TSEP_a$ as it can be seen on FIG. 4B. Thus, the value of the provisional dead-time $D_b^I$ is assigned to the prevailing dead-time $D_a^I$.

In some embodiments, the TSEPs are of a type defined as a voltage measured across a switch of the module in a freewheeling state and during a provoked conduction state of the body-diode. In some operating conditions, a voltage measured in the body diode of the switch is more sensitive to the temperature of the die than a voltage measured in the die in parallel, for example a SiC MOSFET or a GaN HEMT die. In other words, in these examples, the time during which no part of the switch is turned on is artificially increased in order to measure the voltage across a body-diode of the switch of the module in a freewheeling state.

Figure 5:
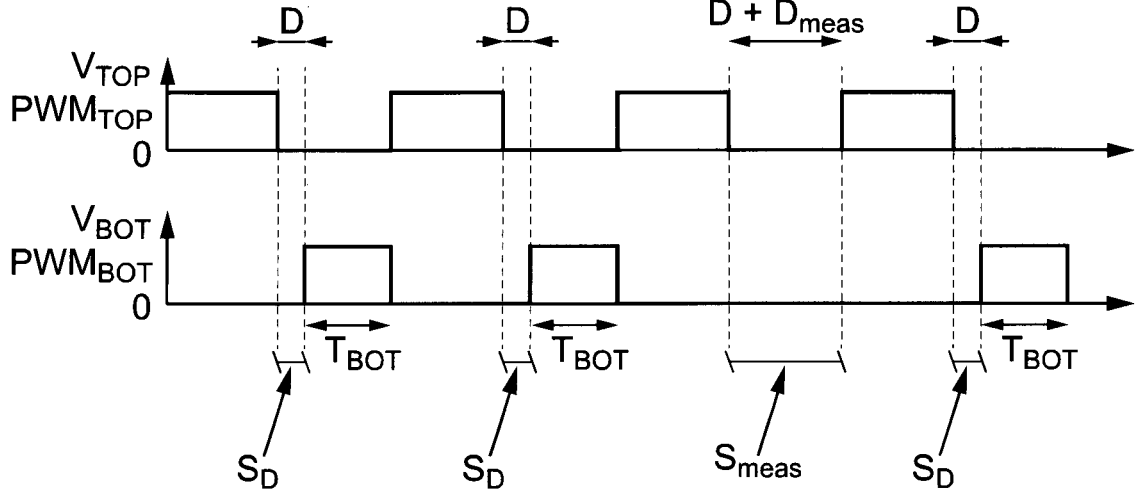
FIG. 5 shows an example of input signals (PWM$_{BOT}$, PWM$_{TOP}$) according to an embodiment of the disclosure.

FIG. 5 shows an example of input signals (PWM BOT, PWM TOP) for these embodiments. The bottom input signal PWM BOT is the input signal of a bottom switch.

In this example, the provoked conduction state, or measurement stage $S_{meas}$, is performed for a body diode of the bottom switch. Said measurement stage $S_{meas}$ is performed for only one switching period, in order to limit the temperature variation due to extra losses in the body diode.

During the other switching stages, or dead-time stages $S_D$, no part of the switch is turned on, i.e $PWM_{TOP}=0$ and $PWM_{BOT}=0$, for a duration equal to the applied dead-time D. The value of the applied dead-time D can be either the value of the prevailing dead-time $D_a$ or the value of the provisional dead-time $D_b$.

During the measurement stage $S_{meas}$, the period during which no part of the switch is turned on is increased to a total duration equal to the sum of the applied dead-time D and a measurement dead-time $D_{meas}$. For example, the value of the measurement dead-time $D_{meas}$ corresponds to a time-response of the voltage sensor and ranges from a hundred of nanoseconds to a hundred of microseconds.

In some examples, as illustrated on FIG. 5, the total duration of the increased dead time is such that the full conduction period is performed under body-diode conduction of the bottom switch, i.e the total duration is equal to the bottom switch's period $T_{BOT}$, which is summarized by the formula:

$$D + D_{meas} = T_{BOT}$$

In other words, the bottom switch. $PWM_{BOT}$ can momentarily skip a conduction period and operate in non-synchronous rectification.

In addition, the dead-time adjustment method can also be performed for a specific current range of the load current periodic waveform corresponding to a free-wheeling state of the module. In this embodiment, the operating parameters comprise at least the load current, said load current having a periodic waveform. The specific current range is comprised within the range from the negative amplitude of the load current periodic waveform to the positive amplitude of the load current periodic waveform. The TSEP is the voltage measured across a switch of the module in the freewheeling state for said specific current range. The TSEP is measured during the measurement stage $S_{meas}$. The measurement stage $S_{meas}$ occurs when the value of the load current is comprised within the specific current range of values. The specific current range is typically chosen so that the TSEP measured during the measurement stage $S_{meas}$ at this specific current range has a high sensitivity to the temperature. In fact, the TSEP, i.e. the voltage measured across a switch of the module in the freewheeling state, depends on both the temperature of the switch and the value of the load current. Measuring the TSEP for said specific current range makes it possible to only have a dependence of the TSEP on the temperature of the switch, with a high sensitivity to the temperature of the switch.

Figure 6:
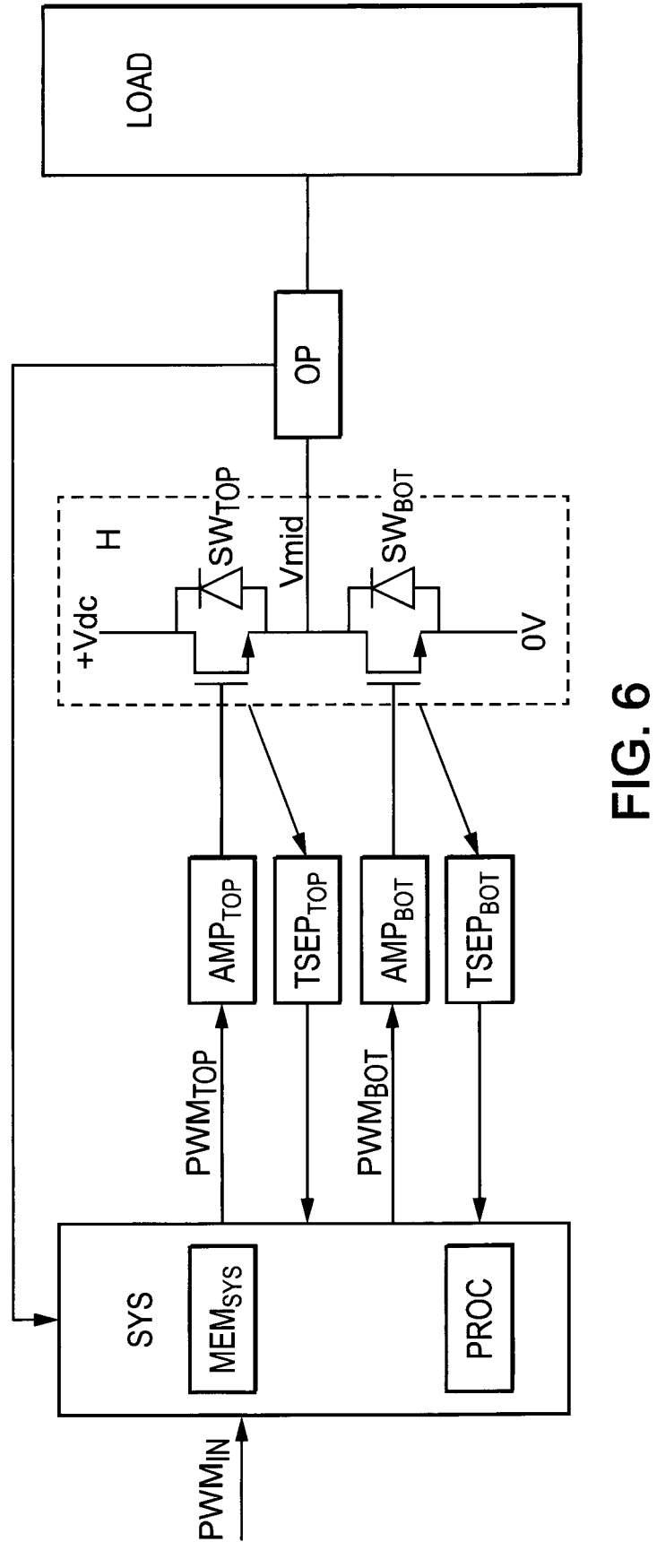
FIG. 6 is an example of an integrated circuit SYS designed to implement a method according to the present disclosure.

On FIG. 6 is sketched an example of an integrated circuit SYS designed to implement a method according to the present disclosure.

The integrated circuit SYS comprises a memory $MEM_{SYS}$ and a processor PROC. In some embodiments, the integrated circuit SYS can comprise an Applications-Specific Integrated Circuit, ASIC, a Field-programmable Gate Array, FGPA, or a microcontroller.

This integrated circuit SYS has for inputs at least an input signal $PWM_{IN}$, at least a measure of a TSEP and at least a measure of an operating parameter OP. In this example two TSEPs are measured ($TSEP_{BOT}$, $TSEP_{TOP}$).

The integrated circuit's memory $MEM_{SYS}$ stores the instructions to be executed by the processor PROC, the values of the operating parameter $I_{load}$ and the values of the two TSEPs ($TSEP_{BOT}$, $TSEP_{TOP}$). The memory $MEM_{SYS}$ is, for example, a buffer. The processor PROC executes the instructions for implementing a method according to the disclosure. The integrated circuit SYS outputs at least two signals related to the input signal $PWM_{IN}$. In this example, the input signal $PWM_{IN}$ is a pulse width modulated, PWM, voltage and the output signals are two pulse width modulated, PWM, voltages ($PWM_{BOT}$, $PWM_{TOP}$).

In this example, a half-bridge H is implemented as a rectifier in the module MOD. This half-bridge H comprises a top switch SW TOP and a bottom switch $SW_{BOT}$ and supplies a load LOAD with a voltage Vmid. Each switch is controlled independently. For instance, the processor PROC provides a top input signal PWM TOP to the top switch $SW_{TOP}$ through a gate driver $AMP_{TOP}$. Said gate driver $AMP_{TOP}$ amplifies the input signal $PWM_{TOP}$ to control the top switch $SW_{TOP}$. In particular, the dead time of the top switch $SW_{TOP}$ is adjusted using a method described in this disclosure. The gate driver $AMP_{TOP}$ is, for example, a buffer. The same applies to the bottom switch $SW_{BOT}$.

In some embodiments, the switches are SiC MOSFET or GaN HEMT devices or any large band gap semiconductors.

Figure 7:
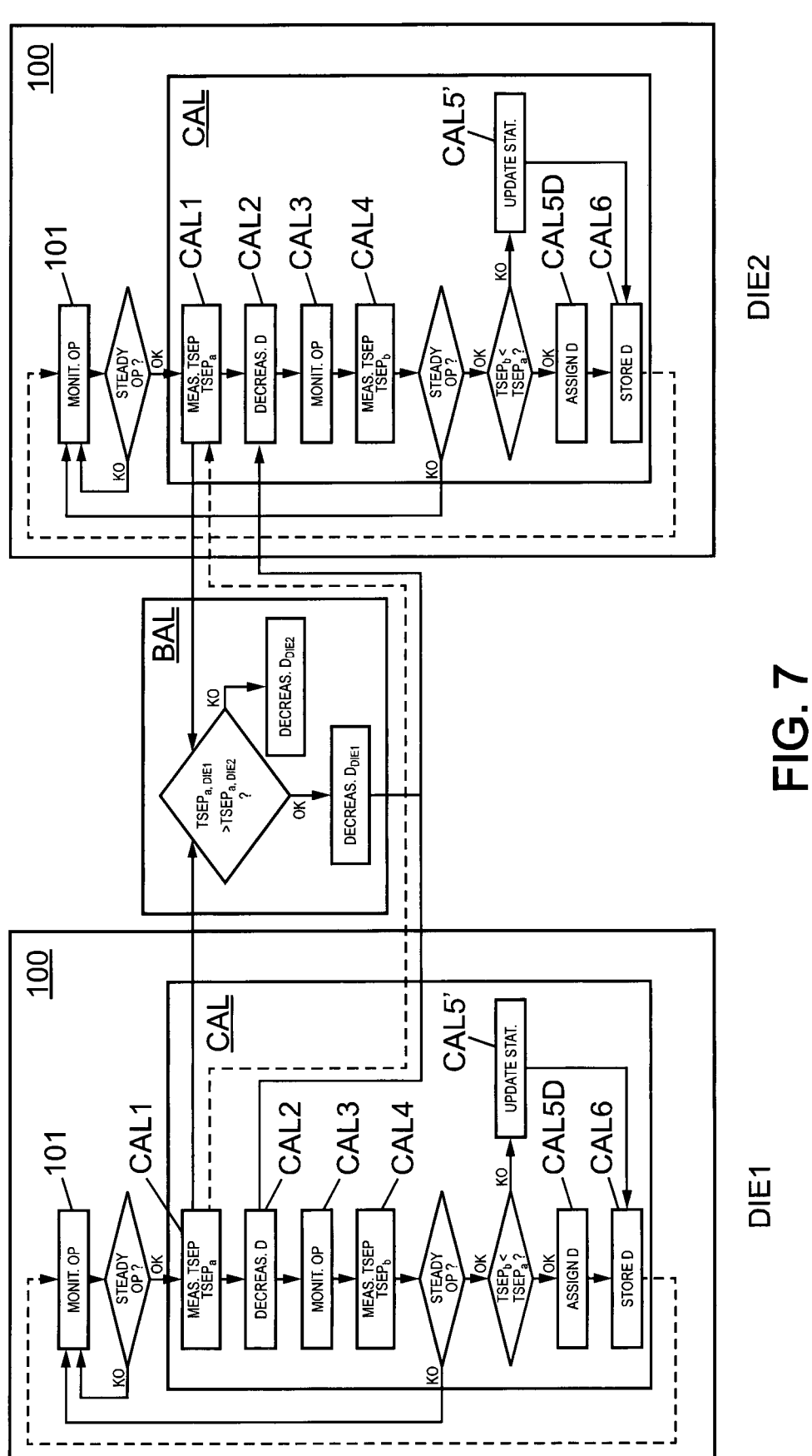
FIG. 7 is a flowchart representing possible stages of a method 100 applied in parallel to two parallel dies of a common power semiconductor module.

In some embodiments, at least one switch is made of at least two parallel dies with an individual gate access. In such cases, the TSEP is, for example, a measure related to the average temperature of the dies. The method 100 can be applied in parallel to the parallel dies and can further include a balancing stage BAL as shown on FIG. 7. Said balancing stage BAL can be executed after every measurement stage (CAL1, CRL4) and can include increasing the dead-time of the die having a measured value of the TSEP corresponding to the highest value of the temperature of the module's dies. For the sake of clarity only a balancing stage BAL after the first measurement stage CAL1 is represented on FIG. 7. This balancing stage BAL can be recursively executed, as symbolized by the dashed lines of FIG. 7, until all dies have the same temperature.

In some embodiments, the module comprises at least two power semiconductors, a circuit monitoring TSEPs, at least a gate driver and a current sensor for implementing a method according to the disclosure.

This disclosure is not limited to the methods, modules and computer programs described here, which are only examples. The invention encompasses every alternative that a person skilled in the art would envisage when reading this text.

The invention claimed is:

1. A method to control a power semiconductor module comprising:
   a) monitoring at least one operating parameter of said power semiconductor module, said at least one parameter including load current and/or input current, ambient temperature, input voltage and/or output voltage value,
   b) only if said at least one operating parameter is kept into a predefined range during a first time, and only if said at least one operating parameter's range of values has an initial non-updated status in a lookup table, initiate at least once a calibration stage, wherein a dead-time results from a previous calibration stage or is set as an initial over-estimated value if no calibration stage has been previously run, said calibration stage including:
   i) measuring a first temperature sensitive electrical parameter;
   ii) decreasing the dead-time to a provisional dead-time;
   iii) during a second time subsequent to the first time, monitoring said at least one operating parameter;
   iv) after said second predefined time, measuring a second temperature sensitive electrical parameter, said second temperature sensitive electrical parameter being of the same type as the first temperature sensitive electrical parameter;
   v) only if said at least one operating parameter has been kept into said predefined range during said second predefined time and the value of the second temperature sensitive electrical parameter corresponds to a lower value of the temperature of power semiconductor module's switch than the temperature value corresponding to the first temperature sensitive electrical parameter, assigning the value of the provisional dead-time to the dead-time; else only if said at least one operating parameter has been kept into said predefined range during said second predefined time and the value of the second temperature sensitive electrical parameter corresponds to a higher value of the temperature of the power semiconductor module's switch than the temperature value corresponding to the first temperature sensitive electrical parameter, updating the status of said at least one operating parameter's range of values in said lookup table,
   vi) storing the dead-time along with said at least one operating parameter's range of values into said lookup table.

2. The method as claimed in claim 1 wherein stages a. and b. are iterated until the status of the operating parameter's range of values is updated in the lookup table.

3. The method as claimed in claim 1, wherein the decreasing of the dead-time is made by a step comprised between 1 and 100 ns.

4. The method as claimed in claim 1, wherein the calibration stage is performed during an operating stage of the power semiconductor module.

5. The method as claimed in claim 1, wherein the temperature sensitive electrical parameters are of a type defined as a voltage measured across a switch of the module in a freewheeling state and during a provoked conduction state of the body-diode.

6. The method as claimed in claim 1, wherein the temperature sensitive electrical parameters themselves are of a type defined as a difference between values of a temperature sensitive electrical parameter before and after an increase of a switching frequency.

7. The method as claimed in claim 6, wherein the operating parameters include at least a current having a periodic waveform and wherein an increase of the switching frequency is performed for a predefined current range of the current periodic waveform.

8. The method as claimed in claim 7, wherein the calibration stage is performed sequentially for different current ranges of a current periodic waveform.

9. The method as claimed in claim 6, wherein each increase of the switching frequency is performed on predefined times shorter than and included in said first time and said second time.

10. The method as claimed in claim 1 applied in parallel to at least two parallel dies of a common power semiconductor module, said module having at least one switch made of at least said two parallel dies with an individual gate access, wherein the temperature of the module's switch corresponds to the average temperature of the dies, and wherein the calibration stage is applied in parallel to the parallel dies, said calibration stage further including a balancing stage, including:

increasing the dead-time of the die having a measured value of the temperature sensitive electrical parameter corresponding to the highest value of the temperature of the module's dies, said balancing stage being applied after the measuring of the first temperature sensitive electrical parameter and/or after the measuring of the second temperature sensitive electrical parameter.

11. The method as claimed in claim 10, wherein the balancing stage is iteratively applied until all dies have a same value of their temperature sensitive electrical parameters.

12. The method as claimed in claim 1, wherein the temperature sensitive electrical parameters are of a type selected among an internal gate resistance of a gate and an on-state voltage at a predefined current value.

13. A computer program comprising instructions A nontransitory computer-readable medium comprising instructions for implementing the method as claimed in claim 1 into an integrated circuit.

14. The power semiconductor module is designed to implement the method as claimed in claim 1.

15. The power semiconductor module as claimed in claim 14 comprising: at least a first sensor for monitoring the at least one operating condition, at least a second sensor for measuring the first and second temperature sensitive electrical parameters, an integrated circuit on which the method is implemented to control the dead-times.

\*    \*    \*    \*    \*